United States Patent [19]
Min et al.

[11] Patent Number: 5,882,950
[45] Date of Patent: Mar. 16, 1999

[54] FABRICATION METHOD FOR HORIZONTAL DIRECTION SEMICONDUCTOR PN JUNCTION ARRAY

[75] Inventors: Suk-Ki Min; Seong-Il Kim; Eun Kyu Kim, all of Seoul, Rep. of Korea

[73] Assignee: Korea Institute Of Science And Technology, Seoul, Rep. of Korea

[21] Appl. No.: 773,185

[22] Filed: Dec. 27, 1996

[30] Foreign Application Priority Data

Apr. 12, 1996 [KR] Rep. of Korea ............... 11000/1996

[51] Int. Cl.⁶ ................ H01L 21/00; H01L 21/36; H01L 21/20; H01L 21/425
[52] U.S. Cl. ............... 438/34; 438/43; 438/44; 438/45; 438/504; 438/506; 438/524; 438/681; 438/745; 438/912; 438/915; 148/DIG. 42; 148/DIG. 50; 148/DIG. 56; 148/DIG. 168
[58] Field of Search .................. 438/22, 34, 42, 438/43, 44, 45, 504, 505, 506, 524, 681, 745, 912, 915, 147, 152, 172; 148/DIG. 42, DIG. 50, DIG. 56, DIG. 168

[56] References Cited

U.S. PATENT DOCUMENTS

| | | | |
|---|---|---|---|
| 3,998,672 | 12/1976 | Miyoshi et al. | 148/171 |
| 4,839,307 | 6/1989 | Imanaka et al. | 437/129 |
| 5,010,556 | 4/1991 | Imanaka et al. | 372/46 |
| 5,693,963 | 12/1997 | Fujimoto et al. | 257/94 |

*Primary Examiner*—Brian Dutton
*Assistant Examiner*—Long Pham
*Attorney, Agent, or Firm*—Darby&Darby

[57] ABSTRACT

A fabrication method for a horizontal direction semiconductor PN junction array which can be achieved when an epitaxial layer is grown by a metalorganic chemical vapor deposition (MOCVD method) by introducing (or doping) a small amount of $CCl_4$ or $CBr_4$ gas, includes forming a recess on an N type GaAs substrate by using a non-planar growth, performing a growth method of a P type epitaxial layer on the N type GaAs substrate by a metalorganic chemical vapor deposition method, and forming a horizontal direction PN junction array of P-GaAs/N-GaAs or P-AlGaAs/N-GaAs by introducing a gas comprising $CCl_4$ or $CBr_4$.

8 Claims, 4 Drawing Sheets

5,882,950

FABRICATION METHOD FOR HORIZONTAL DIRECTION SEMICONDUCTOR PN JUNCTION ARRAY

BACKGROUND OF THE INVENTION

1. Field of the Invention

The present invention relates to a fabrication method for a semiconductor memory device, and in particular, to an improved fabrication method of a level semiconductor PN junction array which allows a significant increase of growth in the horizontal direction so that a PN junction array structure can formed by introduction or doping of a $CCl_4$ or $CBr_4$ gas when a GaAs or AlGaAs epitaxial layer is grown on a GaAs substrate having a V-shaped or U-shaped recess by metalorganic chemical vapor deposition (hereinafter, called MOCVD).

2. Description of the Prior Art

Recently, studies on the fabrication of photoelectro devices on the basis of a chemical composition semiconductor are being conducted, and such photoelectro devices fabrication requires a complicated process.

If a selective epitaxy technology which has been recently studied as one of the MOCVD methods is employed, a three dimensional epitaxial layer can be desirably embodied by putting a test piece in a reaction tube one time without going through a complicated fabrication process for a semiconductor device. As a result, since the complicated construction of a semiconductor device is formed during the growth of a epitaxial layer without being exposed to air during the process, a default and damage on junction boundary surfaces as well as undesired oxidation of the surface of the epitaxial layer can be effectively prevented.

However, in fabricating a photoelectro device for a chemical composition semiconductor according to the conventional art in which the epitaxial layer is formed by the MOCVD method, a horizontal direction PN junction cannot be realized, and therefore, in semiconductor devices using light, the PN junction exists within the semiconductor device, and the light is absorbed into the epitaxial layer before it reaches a PN junction layer, resulting in a large optical loss.

SUMMARY OF THE INVENTION

Accordingly, it is an object of the present invention to provide an improved fabrication method for a horizontal direction PN junction array which is carried out by forming a V-shaped or U-shaped recess on a substrate by using a non-planar growth which is one of the selective epitaxial growth mechanisms and performing an epitaxial layer growth thereon.

To achieve the above object, the improved fabrication method for a horizontal direction PN junction array is characterized in that a P type GaAs or P type AlGaAs is grown only in the V-shaped or U-shaped recess by introducing (or doping) a small amount of a $CCl_4$ or $CBr_4$ gas when a GaAs or AlGaAs epitaxial layer is grown on a GaAs substrate having a V-shaped or U-shaped type recess formed thereon.

When the horizontal direction PN junction array according to the present invention is fabricated using the above-described method, a PN junction portion exists on the surface and consequently an incident light reaches the PN junction portion without any loss. Therefore, the method according the present invention is applied to increase the efficiency of photoelectro devices such as a photodetector or is used for a solar cell or fabricating a low threshold current laser diode or an optical wave guide.

BRIEF DESCRIPTION OF THE DRAWINGS

The present invention will become more fully understood from the detailed description given hereinbelow and the accompanying drawings which are given by way of illustration only, and thus are not limitative of the present invention, wherein:

FIGS. 1A through 1C are schematic views showing a construction of a horizontal direction PN junction array according to the present invention, wherein FIG. 1A is a view showing a construction of a P-GaAs/N-GaAs or P-AlGaAs/N-GaAs PN junction array formed on a semi-insulated GaAs substrate, FIG. 1B is a view showing a construction of a P-GaAs/N-GaAs or P-AlGaAs/N-GaAs PN junction array formed on an N type GaAs substrate, and FIG. 1C is a view showing the construction in which a P type GaAs or P type AlGaAs array is implanted in the N type GaAs substrate;

FIGS. 2A and 2B are cross-sectional views showing an epitaxial layer in a construction of the horizontal direction PN junction array fabricated by introducing $CBr_4$ in the growth of a GaAs epitaxial layer on an array of a V-shaped recess according to the present invention, wherein FIG. 2A is a photograph of the epitaxial layer viewed through a scanning electronic microscope (hereinafter, called SEM) and FIG. 2B is a schematic view of FIG. 2A; and FIGS. 3A and 3B are SEM photographs of a cross-sectional epitaxial layer according to the present invention and the conventional art , wherein FIG. 3A is the SEM photograph of the cross-sectional GaAs epitaxial layer grown on the structure of the V-shaped recess array by introducing $CCl_4$ gas at 0.03 cc/min according to the present invention, and FIG. 3B is the SEM photograph of the cross-sectional epitaxial layer grown according to the conventional art to be compared with FIG. 3A.

DETAILED DESCRIPTION OF THE PREFERRED EMBODIMENTS

The fabrication method for a horizontal direction semiconductor PN junction array according to the present invention will now be described in detail referring to the accompanying drawings.

First, after a test piece on which an N type GaAs epitaxial layer having a thickness of 2~3 $\mu$m is grown or an N type GaAs substrate is formed on a semi-insulated GaAs substrate in the [100] direction, only a portion to be etched is exposed by photolithography, using a photoresist and a photomask, and then a wet etching is performed in the direction of [001] at a predetermined rate using $H_2SO_4$ : $H_2O_2$ : $H_2O$ to form a V-shaped or U-shaped recess. Here, if the width of an etched portion is adjusted, the intervals between the horizontal direction PN junction arrays can be also controlled. Then, on a test piece having the V-shaped or U-shaped recess formed thereon, a $CCl_4$ or $CBr_4$ gas is introduced by a MOCVD method for the growth of a GaAs epitaxial layer. During the growth by the MOCVD method, hydrogen having a high degree of purity is used as a carrier gas and total introduced amount of the gas is 5 liters per minute. In addition, trimethylgallium (TMG) and trimethylaluminium (TMA) are used as a material for an organometal of group I and an arsine gas ($AsH_3$) as a material for an organometal of group V.

Figure 1A:
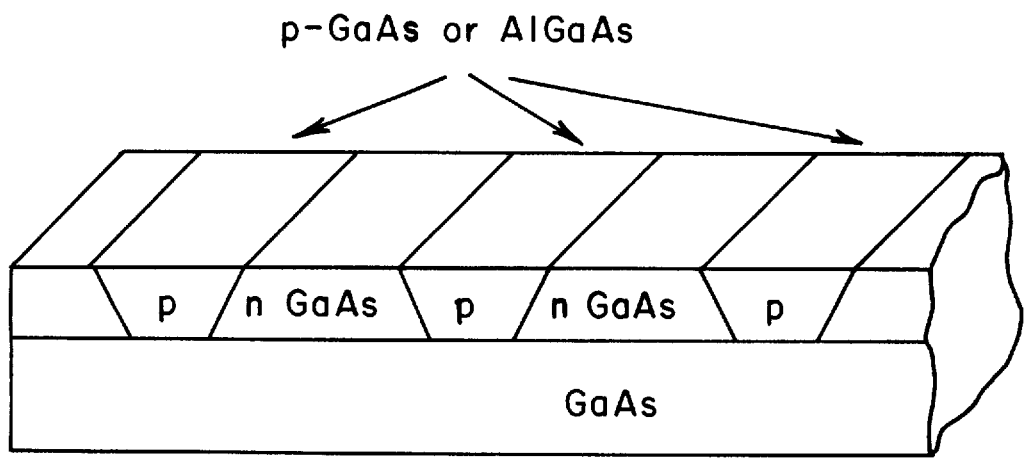
Figure 1B:
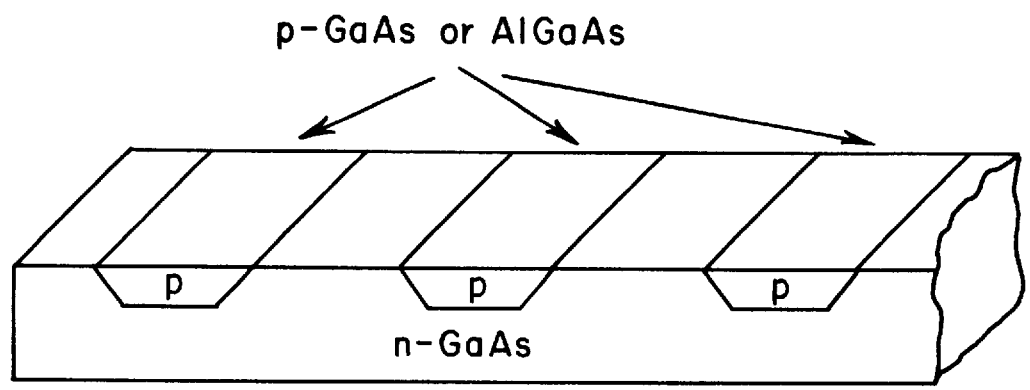
Figure 1C:
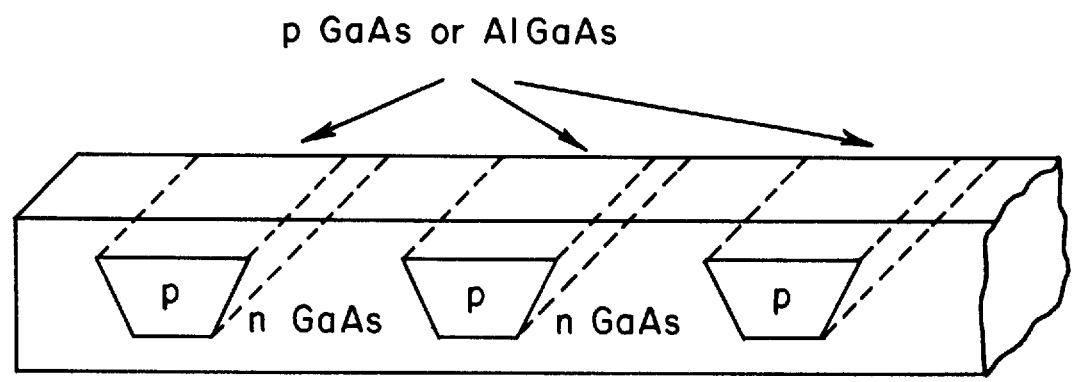

FIGS. 1A through 1C are schematic views showing constructions of a level semiconductor PN junction array according to the present invention, wherein FIG. 1A is a view showing a construction of a P-GaAs/N-GaAs or P-AlGaAs/N-GaAs PN junction array formed on a semi-insulated GaAs substrate, FIG. 1B is a view showing a construction of a P-GaAs/N-GaAs or P-AlGaAs/N-GaAs PN junction array formed on an N type GaAs substrate, and FIG. 1C is a view showing a construction in which a P type GaAs or P type AlGaAs array is implanted in the N type GaAs substrate.

As described above, when the $CCl_4$ or $CBr_4$ gas is introduced (or doped) in growing the epitaxial layer by the MOCVD method on the GaAs substrate having the V-shaped or U-shaped recess formed thereon, a horizontal growth rate is remarkably increased, and since the carbon (C) introduced here serves as a P type dopant, the resultant becomes a P type GaAs or P type AlGaAs, resulting in the construction of the horizontal direction PN junction array. Here, the horizontal growth rate can be controlled by adjusting the introducing rate or changing the growth temperature of the $CCl_4$ or $CBr_4$ gas.

Figure 2A:
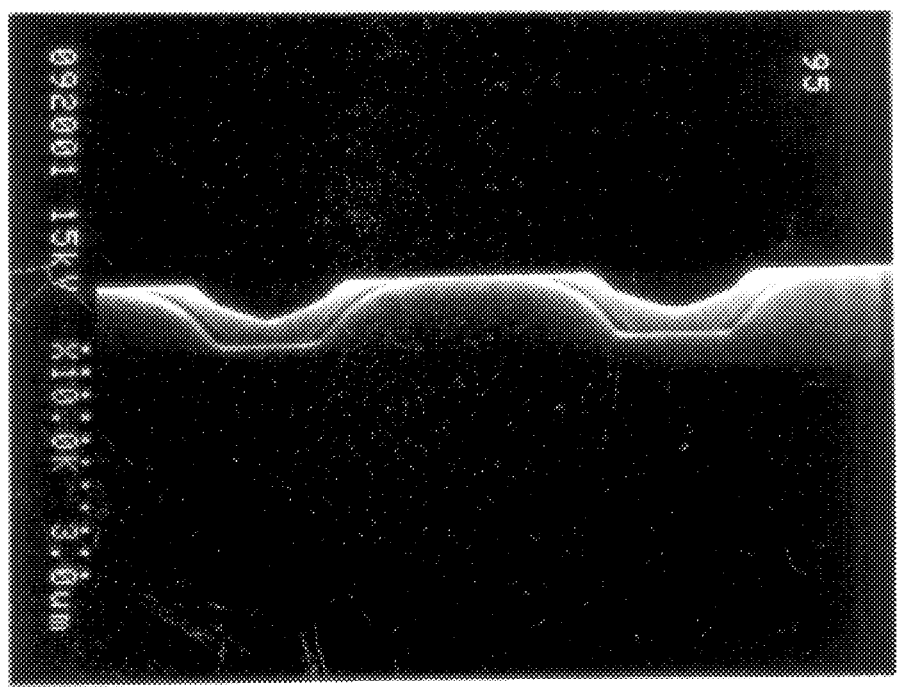
Figure 2B:
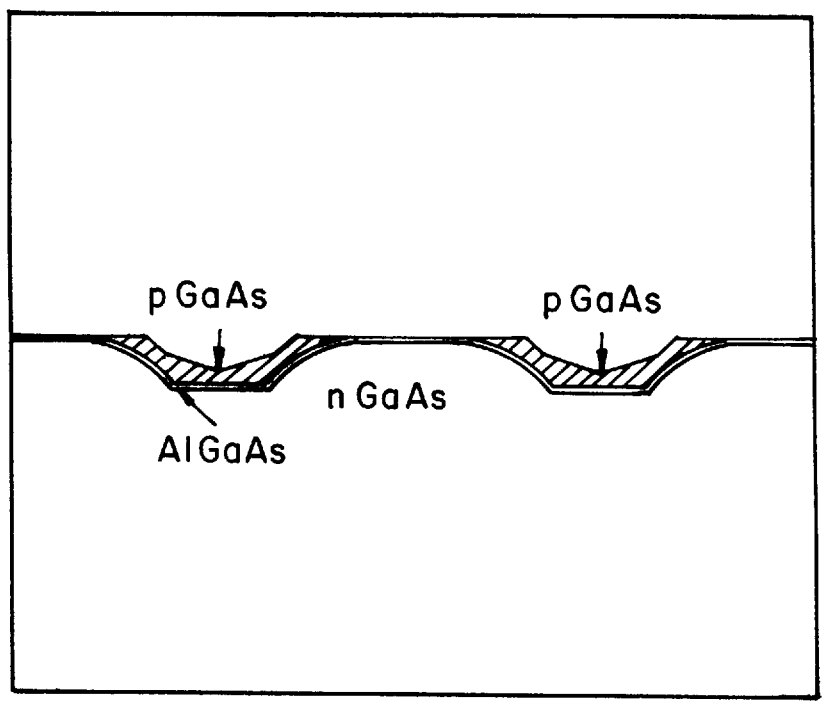

FIGS. 2A and 2B are cross-sectional view showing an epitaxial layer in a construction of the horizontal direction PN junction array fabricated by the introduction of $CBr_4$ in the growth of a GaAs epitaxial layer on an array of a V-shaped recess, wherein FIG. 2A is an SEM photograph of the epitaxial layer and FIG. 2B is a schematic view of FIG. 2A. Here, an N type GaAs is used as a substrate and a P type GaAs as a newly grown epitaxial layer filling the V-shaped recess. A black line in FIG. 2A is an AlGaAs layer (marker layer) grown for effectively observing the growth of the GaAs epitaxial layer. Meanwhile, the intervals between the PN junction arrays can be controlled by the mask used in etching the substrate before the growth of the epitaxial layer, and the shape or height of the P type GaAs filling the V-shaped recess can be adjusted by changing the growth conditions of the MOCVD method, as described above.

Figure 3A:
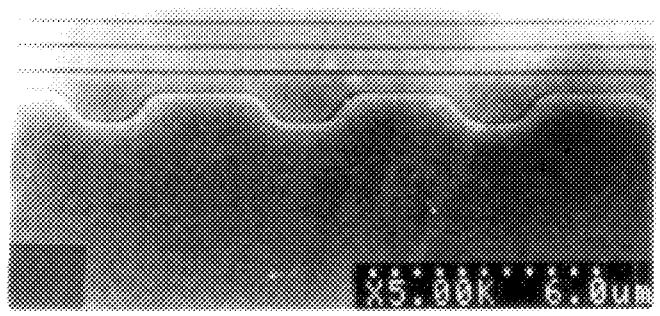
Figure 3B:
Figure 3B:

FIG. 3A is an SEM photograph of the cross-sectional GaAs epitaxial layer grown on the construction of the V-shaped recess array by introducing $CCl_4$ gas at 0.03 cc/min by the MOCVD method, and the black line in FIG. 3A indicates an AlGaAs layer (marker layer) grown for effectively observing the growth of the GaAs epitaxial layer, and a complete planarization is realized from the first layer of the V-shaped recess. FIG. 3B is the SEM photograph of the cross-sectional epitaxial layer grown without the introduction of a $CCl_4$ gas to be compared with FIG. 3A, according to the conventional art, wherein a planarization is not achieved at all even after several layers are grown and remains the V-shaped recess.

As described above in detail, when a GaAs or AlGaAs epitaxial layer is grown using an N type GaAs substrate having a V-shaped or U-shaped recess, a P type GaAs or P type AlGaAs is formed only in the V-shaped or U-shaped recess by introducing (or doping) a $CCl_4$ or $CBr_4$ gas, resulting in the formation of the horizontal direction PN junction array. Accordingly, a PN junction portion exists on the surface and consequently an incident light reaches the PN junction portion without any loss. Therefore, the method according to the present invention is applied to increasing the efficiency of such a photoelectro device as a photodetector or a solar cell or fabricating a low threshold current laser diode or an optical wave guide.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A fabrication method for a horizontal direction PN junction array, comprising:

forming a recess on an N type GaAs substrate by non-planar growth;

growing a P type epitaxial layer on the N type GaAs substrate by metalorganic chemical vapor deposition to form a horizontal direction PN junction array of P-GaAs/N-GaAs or P-AlGaAs/N-GaAs by introducing a gas of $CCl_4$ or $CBr_4$.

2. The method of claim 1, wherein the recess on the N type GaAs substrate is formed as a V-shaped or U-shaped pattern.

3. The method of claim 2, wherein the recess on the N type GaAs substrate is formed as a V-shaped or U-shaped pattern by a photolithography using a photomask, and etched by wet etching to form the V-shaped or U-shaped recess.

4. The method of claim 3, wherein the wet etching is carried out using $H_2SO_4:H_2O_2:H_2O$.

5. The method of claim 1, wherein a P type GaAs or a P type AlGaAs epitaxial layer is formed only in the recess of the N type GaAs substrate.

6. The method of claim 2, wherein a P type GaAs or a P type AlGaAs epitaxial layer is formed only in the recess of the N type GaAs substrate.

7. The method of claim 1 wherein the GaAs substrate is in the (100) direction.

8. The method of claim 3 wherein the etching is performed in the (001) direction.

* * * * *